United States Patent
Wang et al.

(10) Patent No.: US 7,525,848 B2
(45) Date of Patent: Apr. 28, 2009

(54) METHOD FOR ERASING AND CHANGING DATA OF FLOATING GATE FLASH MEMORY

(75) Inventors: Yung-Hsin Wang, Hsinchu County (TW); Ting-Kuo Yen, Miao-Li Hsien (TW); I-Nan Chen, Taichung County (TW)

(73) Assignee: AMIC Technology Corporation, Hsin-Chu (TW)

( * ) Notice: Subject to any disclaimer, the term of this patent is extended or adjusted under 35 U.S.C. 154(b) by 132 days.

(21) Appl. No.: 11/780,479

(22) Filed: Jul. 20, 2007

(65) Prior Publication Data

US 2008/0304329 A1    Dec. 11, 2008

(30) Foreign Application Priority Data

Jun. 11, 2007    (TW) .............................. 96121016 A

(51) Int. Cl.
  *G11C 11/34*    (2006.01)
(52) U.S. Cl. ............................. 365/185.33; 365/185.29; 365/185.18
(58) Field of Classification Search ............ 365/185.33, 365/185.29, 185.18
See application file for complete search history.

(56) References Cited

U.S. PATENT DOCUMENTS

| 5,490,110 | A  | * | 2/1996 | Sawada et al. | ......... | 365/185.03 |
| 6,421,272 | B1 | * | 7/2002 | Noguchi | ................. | 365/185.05 |
| 7,366,014 | B2 | * | 4/2008 | Micheloni et al. | ...... | 365/185.03 |

* cited by examiner

Primary Examiner—Tuan T. Nguyen
(74) Attorney, Agent, or Firm—Winston Hsu

(57) ABSTRACT

A method for erasing data stored in the memory cells of the floating gate flash memory is included. The method allows a plurality of sectors to be disposed in a same P well. The method includes erasing data stored in a first set of memory cells according to a control signal, randomly reading the data stored in a second set of memory cells affected by the erasing action of the first set of memory cells, and writing data read from the second set of memory cells onto the second set of memory cells.

14 Claims, 2 Drawing Sheets

METHOD FOR ERASING AND CHANGING DATA OF FLOATING GATE FLASH MEMORY

BACKGROUND OF THE INVENTION

1. Field of the Invention

The present invention relates to a method for erasing and changing data, and more particularly, to a method for erasing and changing data of a floating gate flash memory.

2. Description of the Prior Art

Flash memories generally are divided into groups of floating gates and split gates. The floating gate flash memories are utilized in portable electronic devices, a computer basic input/output system (BIOS), and other electronic devices because of the small size and the good programming/erasing endurance of the floating gates. In conventional floating gate flash memories, memory cells in a same p well are set up as a sector, and an insulation layer is further disposed around the p well so as to insulate the memory cells of one sector from memory cells of other sectors. The disposal of the insulation layers reduces the efficiency of the flash memories. That is, the more insulation layers are disposed, the less of the flash memories can be used. Thus, the p wells of the floating gate flash memories are designed of wider area for reducing the disposal of the insulation layers and increasing the efficiency of the flash memories.

In a same p well, all memory cells are electrically related. Thus, if the memory cells of the same p well are divided into different sectors, when one sector of the same p well erases, other sectors of the same p well are disturbed by the action of the erasing. When the disturbance accumulates over a certain level, data "0" stored in the disturbed memory cell becomes "1" (data "1" stored in the disturbed memory cell does not become "0"). Therefore, conventional floating gate flash memories have to be designed with the memory cells in a same p well to be one sector. When any data of any memory cells in the p well changes, all of the memory cells in the p well (sector) have to be erased (to be "1"), and then written again for insurance of the data correction. Such way is very time-consuming and causes inconvenience.

For example, the size of the sector of the floating gate flash memory is designed to store 64 K bytes in a p well. That is, 256 word lines are disposed, each word line corresponds to 256'8 bit lines, and the memory cells are interwoven by the word lines and bit lines and thus the amount of the memory cells is 256×256 (64 K bytes). Every time when one memory cell is erased or programmed, all of the 64-K-bytes memory cells (all the memory cells corresponding to the 256 word lines) have to be erased and then reprogrammed, which is not convenient.

SUMMARY OF THE INVENTION

The present invention provides a method for erasing data of a floating gate flash memory. The method comprises erasing data of a first set of memory cells according to a control signal, reading data of a second set of memory cells of a memory block affected by erasing the data of the first set of memory cells, and writing the read data into the second set of the memory cells.

The present invention further provides a method for changing data of a floating gate flash memory. The method comprises erasing data of a first set of memory cells according to a control signal, reading data of a second set of memory cells of a memory block affected by erasing the data of the first set of memory cells, writing the read data into the second set of the memory cells, and changing data of the first set of the memory cells according to the control signal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
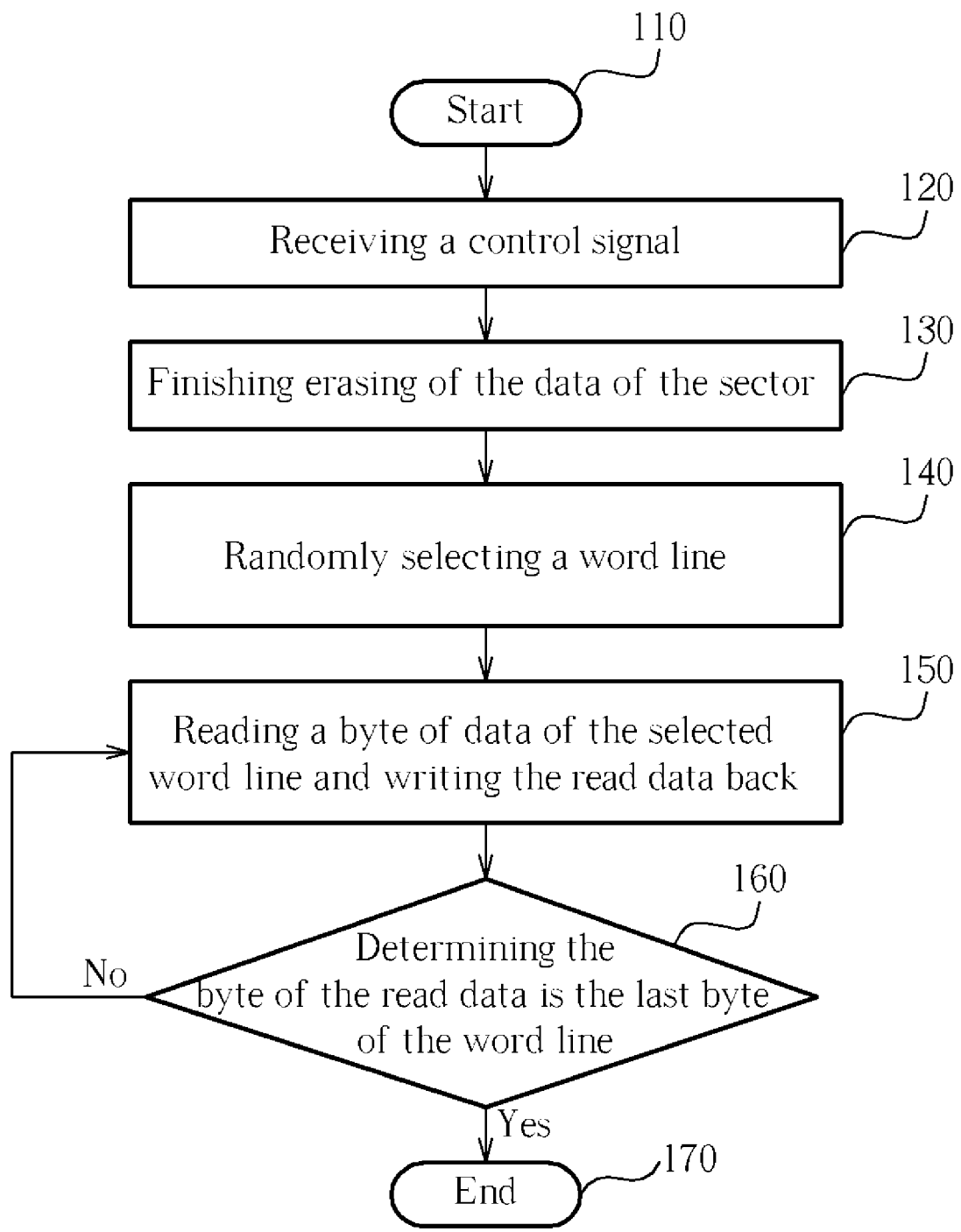
FIG. 1 is a flowchart of the method for erasing data of the floating gate flash memory of the present invention.

Please refer to FIG. 1. FIG. 1 is a flowchart of the method 100 for erasing data of the floating gate flash memory of the present invention. The steps are described as follows:

Step 110: Start;

Step 120: Receiving a control signal for erasing data of a sector;

Step 130: Finishing erasing of the data of the sector;

Step 140: Randomly selecting a word line in the p well where the sector is located;

Step 150: Reading a byte of data of the selected word line and writing the read data back to the address where the byte of data has been read;

Step 160: Determining the byte of the read data is the last byte of the word line; if not, go to step 150; if yes, go to step 170;

Step 170: End.

The definition of sector described above, in the present invention, does not have to be the entire set of memory cells in the p well (for example, 64 K bytes). In the present invention, the sector can be as small as only the memory cells corresponding to one word line (256 bytes). Thus, when the erasing is executed, in the present invention, the memory cells, in the same p well, do not have to be all erased and the part that is not erased written.

The spirit of the method 100 for erasing data of the floating gate memory of the present invention is selecting one word line for executing reading and re-writing actions after a sector of the same p well is erased. That is, after a sector is erased, one word line of the same p well is selected and the memory cells corresponding to the word line is refreshed. For example, after a sector is erased, other memory cells of the same p well, where the erased sector is located, are disturbed. Assume one of the memory cells stores data "0" and the initial threshold voltage of storing data "0" is the voltage Vtp, the threshold voltage lowered by the disturbance each time is constant and is ΔVtp, the reference threshold voltage for determining data "0" or "1" is Vtr, and N is the amount of erasing executed in a same p well. As long as the inequality of [Vtp−(N×ΔVtp)>Vtr] remains true, the threshold voltage of storing data "0" after suffering the disturbance is still higher than the reference threshold Vtr, and the data of the memory cell is not misread for "1". According to the inequality of [Vtp−(N×ΔVtp)>Vtr], the maximum of N can be figured out under the condition of data correction. Thus, the present invention refreshes data (read and write back) to raise the threshold voltage of the stored data for insuring the correction before the data is disturbed too much, which causes misreading.

But, refreshing all other sectors in the same p well after "every" time of erasing a sector is unnecessary and wasting time. The condition of causing misreading is that the amount N must be big enough (like several 10,000 times) and the disturbed memory cells are not refreshed.

In step 140, the way to select one word line to be refreshed can be randomly or can be programmed. The spirit of the step 140 is that each of the word lines has equal probability to be selected. In this way, each word line is certain to selected in limited amount of erasing actions, and the corresponding data is refreshed so that the threshold voltage of the data "0" is not lowered below the reference threshold Vtr, causing misreading. For example, after the erasing action is successively executed for 5000 times, the probability of each of the 256 word lines in the same p well to be randomly selected is: [1−(256/256)]5000=99.9999997%, and it is nearly to say each word line is selected to refresh at least one time during the 5000 times when the amount of the erasing actions causing misreading is about several 10,000 times. Once the data is refreshed, the disturbance accumulated is also eliminated. Thus, by the method of the present invention, the misreading situation is effectively avoided.

Therefore, according to the method of the present invention, the size of the sector can be reduced lower than the amount of the entire set of memory cells in the same p well. That is, according to the method of the present invention, several sectors can be designed in a same p well.

Figure 2:
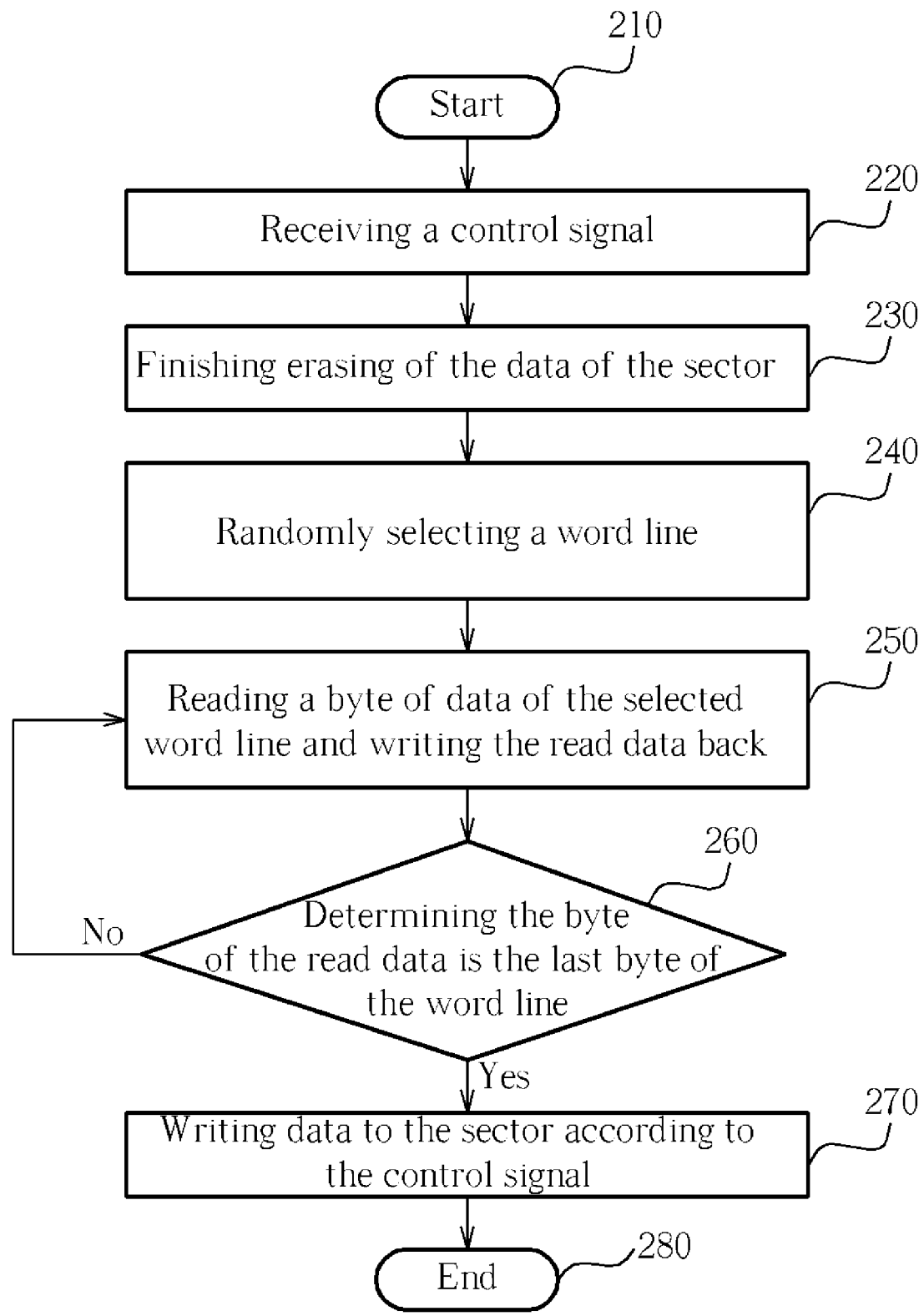
FIG. 2 is a flowchart of the method for changing data of the floating gate flash memory of the present invention.

Please refer to FIG. 2. FIG. 2 is a flowchart of the method 200 for changing data of the floating gate flash memory of the present invention. The steps are described as follows:

Step 210: Start;

Step 220: Receiving a control signal for erasing data of a sector;

Step 230: Finishing erasing of the data of the sector;

Step 240: Randomly selecting a word line in the p well where the sector is located;

Step 250: Reading a byte of data of the selected word line and writing the read data back to the address where the byte of data has been read;

Step 260: Determining the byte of the read data is the last byte of the word line; if not, go to step 150; if yes, go to step 170;

Step 270: Writing data to the sector according to the control signal;

Step 280: End.

The definition of sector described above, in the present invention, does not have to be the entire set of memory cells in the p well (for example, 64 K bytes). In the present invention, the sector can be as small as only the memory cells corresponding to one word line (256 bytes). Thus, when the erasing is executed, in the present invention, the memory cells, in the same p well, do not have to be all erased and the memory cells that are not erased written back.

The spirit of the method 200 for changing data of the floating gate memory of the present invention is selecting one word line for executing reading and re-writing actions after a sector of the same p well is erased. That is, after a sector is erased, one word line of the same p well is selected and the memory cells corresponding to the word line is refreshed. For example, after a sector is erased, other memory cells of the same p well, where the erased sector is located, are disturbed. Assume one of the memory cells stores data "0" and the initial threshold voltage of storing data "0" is the voltage Vtp, the threshold voltage lowered by the disturbance each time is constant and is $\Delta$Vtp, the reference threshold voltage for determining data "0" or "1" is Vtr, and N is the amount of erasing executed in a same p well. As long as the inequality of [Vtp−(N×$\Delta$Vtp)>Vtr] remains true, the threshold voltage of storing data "0" after suffering the disturbance is still higher than the reference threshold Vtr, and the data of the memory cell is not misread for "1". According to the inequality of [Vtp−(N×$\Delta$Vtp)>Vtr], the maximum of N can be figured out under the condition of data correction. Thus, the present invention refreshes data (read and write back) to raise the threshold voltage of the stored data for insuring the correction before the data is disturbed too much, which causes misreading.

But, refreshing all other sectors in the same p well after "every" time of erasing a sector is unnecessary and wasting time. The condition of causing misreading is that the amount N must be big enough (like several 10,000 times) and the disturbed memory cells are not refreshed. In step 240, the way to select one word line to be refreshed can be randomly or can be programmed. The spirit of the step 240 is that each of the word line has equal probability to be selected. In this way, each word line is certain to be selected in limited amount of erasing actions, and the corresponding data is refreshed so that the threshold voltage of the data "0" is not lowered below the reference threshold Vtr, causing misreading. For example, after the erasing action is successively executed for 5000 times, the probability of each of the 256 word lines in the same p well to be randomly selected is: [1−(256/256)] 5000=99.9999997%, and it is nearly to say each word line is selected to refresh at least one time during the 5000 times where the amount of the erasing actions causes misreading is about several 10,000 times. Once the data is refreshed, the disturbance accumulated is also eliminated. Thus, by the method of the present invention, the misreading situation is effectively avoided.

Therefore, according to the method of the present invention, the size of the sector can be reduced lowered than the amount of the entire memory cells in the same p well. That is, according to the method of the present invention, several sectors can be designed in a same p well.

Those skilled in the art will readily observe that numerous modifications and alterations of the device and method may be made while retaining the teachings of the invention.

What is claimed is:

1. A method for erasing data of a floating gate flash memory, the method comprising:
   erasing data of a first set of memory cells according to a control signal;
   reading data of a second set of memory cells of a memory block affected by erasing the data of the first set of memory cells; and
   writing the read data into the second set of the memory cells.

2. The method of claim 1, wherein reading data of the second set of memory cells of the memory block affected by erasing the data of the first set of memory cells comprises randomly reading data of the second set of memory cells of the memory block affected by erasing the data of the first set of memory cells.

3. The method of claim 1, wherein reading data of the second set of memory cells of the memory block affected by erasing the data of the first set of memory cells comprises reading data of the second set of memory cells not insulated from the first set of memory cells.

4. The method of claim 3, wherein reading data of a second set of memory cells not insulated from the first set of memory cells comprises reading data of a second set of memory cells disposed in same p type well as the first set of memory cells.

5. The method of claim 4, wherein reading data of the second set of memory cells disposed in same p type well as the first set of memory cells is reading data of the second set of memory cells disposed in same p type well as the first set of memory cells, the p same type well being surrounded by an insulation layer.

6. The method of claim 1, wherein erasing data of the first set of memory cells according to the control signal is erasing data of the first set of memory cells of at least a word line according to the control signal.

7. The method of claim 1, wherein reading data of the second set of memory cells of the memory block affected by erasing the data of the first set of memory cells comprises reading data of the second set of memory cells of a word line of the memory block affected by erasing the data of the first set of memory cells.

8. A method for changing data of a floating gate flash memory, the method comprising:
   erasing data of a first set of memory cells according to a control signal;
   reading data of a second set of memory cells of a memory block affected by erasing the data of the first set of memory cells;
   writing the read data into the second set of the memory cells; and
   changing data of the first set of the memory cells according to the control signal.

9. The method of claim 8, wherein reading data of the second set of memory cells of the memory block affected by erasing the data of the first set of memory cells comprises randomly reading data of the second set of memory cells of the memory block affected by erasing the data of the first set of memory cells.

10. The method of claim 8, wherein reading data of the second set of memory cells of the memory block affected by erasing the data of the first set of memory cells comprises reading data of the second set of memory cells not insulated from the first set of memory cells.

11. The method of claim 10, wherein reading data of a second set of memory cells not insulated from the first set of memory cells comprises reading data of a second set of memory cells disposed in same p type well as the first set of memory cells.

12. The method of claim 11, wherein reading data of the second set of memory cells disposed in same p type well as the first set of memory cells is reading data of the second set of memory cells disposed in same p type well as the first set of memory cells, the p same type well being surrounded by an insulation layer.

13. The method of claim 8, wherein erasing data of the first set of memory cells according to the control signal is erasing data of the first set of memory cells of at least a word line according to the control signal.

14. The method of claim 8, wherein reading data of the second set of memory cells of the memory block affected by erasing the data of the first set of memory cells comprises reading data of the second set of memory cells of a word line of the memory block affected by erasing the data of the first set of memory cells.

* * * * *